(12) United States Patent
Suelzle et al.

(10) Patent No.: US 12,210,044 B2
(45) Date of Patent: Jan. 28, 2025

(54) METHOD FOR DETERMINING THE ELECTRICAL RESISTANCE OF AN ELECTRIC SUPPLY LINE

(71) Applicant: Robert Bosch GmbH, Stuttgart (DE)

(72) Inventors: Helmut Suelzle, Pleidelsheim (DE); Otmar Bussmann, Abstatt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 160 days.

(21) Appl. No.: 17/611,094

(22) PCT Filed: May 14, 2020

(86) PCT No.: PCT/EP2020/063421
§ 371 (c)(1),
(2) Date: Nov. 12, 2021

(87) PCT Pub. No.: WO2020/249355
PCT Pub. Date: Dec. 17, 2020

(65) Prior Publication Data
US 2022/0229098 A1 Jul. 21, 2022

(30) Foreign Application Priority Data
Jun. 8, 2019 (DE) ..................... 10 2019 208 402.8

(51) Int. Cl.
*G01R 27/08* (2006.01)
*B60R 16/02* (2006.01)
(52) U.S. Cl.
CPC .............. *G01R 27/08* (2013.01); *B60R 16/02* (2013.01)
(58) Field of Classification Search
CPC ........ G01R 27/08; G01R 27/16; G01R 31/54; B60R 16/02
See application file for complete search history.

(56) References Cited

U.S. PATENT DOCUMENTS

| 8,552,749 B2 | 10/2013 | Heath et al. |
| 2003/0163170 A1 | 8/2003 | Faisandier |

(Continued)

FOREIGN PATENT DOCUMENTS

| CN | 104283209 A | 1/2015 |
| CN | 205263278 U | 5/2016 |

(Continued)

OTHER PUBLICATIONS

International Search Report for PCT/EP2020/063421, Issued Jul. 30, 2020.

*Primary Examiner* — Akm Zakaria
(74) *Attorney, Agent, or Firm* — NORTON ROSE FULBRIGHT US LLP; Gerard A. Messina

(57) ABSTRACT

A method for determining an electrical resistance of an electrical supply lead of an electrical system. The system is connected to a first and a second electrically conductive supply lead, which are electrically conductively connected on the current-source side. The system is configured to electrically connect an electrical load of the system selectably to the first or to the second supply lead. The method includes: configuring an electrical connection between the first supply lead and the load; configuring an electrical interruption between the second supply lead and electrical loads of the system; impressing a current in the first supply lead; determining a first voltage at the input of the first supply lead; determining a second voltage at the input of the second supply lead; determining a first resistance value of the first supply lead using the first and the second voltage and the impressed current.

12 Claims, 3 Drawing Sheets

(56) References Cited

U.S. PATENT DOCUMENTS

| | | | |
|---|---|---|---|
| 2006/0119368 A1* | 6/2006 | Sela | G01R 31/52 |
| | | | 324/522 |
| 2012/0212235 A1* | 8/2012 | Hein | H02H 11/001 |
| | | | 324/503 |
| 2015/0006095 A1* | 1/2015 | Voisine | G01R 27/205 |
| | | | 702/65 |
| 2016/0181816 A1* | 6/2016 | Kinnard | H02J 4/00 |
| | | | 307/29 |
| 2016/0285276 A1* | 9/2016 | Gehrke | H03K 17/082 |
| 2017/0059638 A1* | 3/2017 | Griffiths | G01R 1/06788 |
| 2018/0219481 A1* | 8/2018 | Bruhn, Jr. | G01R 19/175 |

FOREIGN PATENT DOCUMENTS

| | | |
|---|---|---|
| CN | 106068458 A | 11/2016 |
| CN | 106104283 A | 11/2016 |
| DE | 102010003353 A1 | 9/2011 |

\* cited by examiner

METHOD FOR DETERMINING THE ELECTRICAL RESISTANCE OF AN ELECTRIC SUPPLY LINE

FIELD

The present invention relates to a method for determining at least one electrical resistance of an electrical supply lead of an electrical system, the system being connected to at least a first and a second electrically conductive supply lead.

BACKGROUND INFORMATION

Methods for monitoring leads, and a device for monitoring leads in order to carry out the method, are described in German Patent Application No. DE 10 2010 003353. The method serves for monitoring of leads in a system in which at least one electrical load is connected via the leads to a central power system; a test signal being sent via a monitoring device onto the leads in order to determine the electrical resistance of the leads; influences of the at least one load being compensated for.

SUMMARY

Electrical loads are powered from an energy source or current source via electrically conducting connections such as supply leads, contacts, connectors, or ground connections. The electric current flows via resistances that are produced, inter alia, by the electrically conducting connection points. Depending on the magnitude of the current and the resistance, the voltage present at the load is then less than is being furnished by the energy source or current source itself. The resistance in the leads and connection points increases as a result of service life, media effects, and dynamic and thermal stress, thus resulting in a reduced voltage supply to the load and reduced performance of that load. By measuring voltages and currents it is possible to infer a value of a resistance, i.e., the quantitative magnitude of the resistance, in accordance with Ohm's law, since a change in current results in a change in voltage caused by the resistance; this creates the possibility of predicting a voltage drop at higher currents by way of a determination of the resistance at a low current.

The corresponding change in voltage is ascertained, for example, via one of the mechanisms below. On the one hand, a voltage can be measured before and after a change in current, and the change in voltage calculated therefrom can be used to ascertain the resistance. During this measurement, influences due to other loads that are being powered from the same current source, for example the loads in the same internal electrical system of a vehicle, result in errors, since they cannot be recognized and taken into consideration. On the other hand, it would be possible to detect the voltage difference directly by way of an additional measurement lead in order to reduce the influences of other loads using the same current source. This would result, however, in a greater space requirement, for instance for the terminals, and would be associated with higher costs.

An example embodiment of the present invention is based on the recognition that for systems that are connected to a current source by way of a first and a second electrically conductive supply lead, an accurate determination of the electrical resistance of one of those supply leads is possible by impressing a current for the resistance determination into only one of the two supply leads.

Doubled supply leads of this kind can be provided for systems in which a failure of the system can have a serious impact on the system as a whole. Upon failure of one of the supply leads, the system can then continue to be operated via the second supply lead. This can be provided, for example, in a vehicle for an electrically operated braking system, which is obviously safety-relevant for the driving of a vehicle.

A method for determining at least one electrical resistance of an electrical supply lead of an electrical system, a method for predicting a voltage drop, an apparatus, a computer program product, and a machine-readable storage medium are provided in accordance with example embodiments of the present invention, which at least in part achieve the objects recited, are described. Advantageous embodiments of the present invention are disclosed herein.

In accordance with an example embodiment of the present invention, a method for determining at least one electrical resistance of an electrical supply lead of an electrical system is provided, the system being connected to at least a first and a second electrically conductive supply lead. The supply leads are electrically conductively connected on the current-source side, and the system is configured to electrically connect an electrical load of the system selectably to the first or to the second supply lead.

In one step of the example method, an electrical connection is configured between the first supply lead and the load. In a further step, an electrical interruption is configured between the second supply lead and electrical loads of the system. In a further step, a current is impressed into the first supply lead. In addition, a first voltage at the input of the first supply lead of the system is determined, the current being impressed in the first supply lead. A second voltage at the input of the second supply lead of the system is also determined, the current likewise being impressed in the first supply lead. In a further step, the first resistance value of the first supply lead is determined by way of the first and the second voltage and the impressed current.

The electrical resistance of the electrical supply of an electrical system which is to be determined is obtained on the one hand by way of the electrically conducting connections themselves, and on the other hand from the resistance values of electrically conducting connection points, such as leads, contacts, connectors, and/or ground connections. The "electrical resistance of an electrical supply lead of an electrical system" is to be understood as the sum of such electrically effective resistances for supplying the electrical system with electrical energy by way of a supply lead.

Depending on the magnitude of the current and on the resistance of such a supply lead, the voltage present at the load is lower than what is furnished by the energy source. A voltage drop across a contact in a supply lead of this kind at high currents and not very high voltages, as can occur, for instance, in an electrically operating braking system of a vehicle, can be relevant in terms of sufficient voltage supply to the braking system based on the absolute magnitude of the load currents that occur. The resistance in the leads and connections increases as a result of service life, media effects, and dynamic and thermal stress, thus resulting in a reduced voltage supply to the load and hence reduced performance of such a load, for example a braking system, over a system life.

A double supply lead of this kind for an electrical system, having a first and a second electrical conductive supply lead, can have, on the connector side of the system, two connectors to the system. At least when these two supply leads are powered from one current source, i.e., one energy supply, they are therefore electrically connected to one another on the current-source side.

A "supply lead" is to be understood in the present context to mean that a connection to one pole of the current source is effected by way of that lead. The connection to the second pole of the current source is made by way of a connection via a ground contact. A ground contact of this kind can be embodied as an actual connection to an electrically conductive extended component, but can also be configured as a further electrical lead, in the sense of a cable, from the load to the second pole of the current source.

An electrical system of this kind, which is designed to be supplied with electrical energy by way of two supply leads, can be designed to be connected to an electrical load of the system with only one of the two supply leads in a connected state. The other of the two supply leads can be provided to supply electrical energy to another subassembly, or another load, of the system. In order to supply the load with energy alternatively from the one or the other of the two supply leads, the system can be configured, for instance by way of three switches, to connect the load of the system to the first or to the second supply lead. The three switches can furthermore be configured in such a way that another subassembly or another load is electrically disconnectably connected to the corresponding other supply lead. By way of these three switches, for example, an electrical connection between the first supply lead and the load, and an electrical interruption between the second supply lead and further electrical loads of the system, for example another subassembly or another load, can then be established, with the result that the second supply lead is unloaded.

A second unloaded supply lead is impinged upon, by comparison with the electrical current of the load of the system which is flowing in the first supply lead or is impressed in the first supply lead, with a current that is as low as necessitated by the accuracy requirement for determining the resistance. In practice, this can mean that what flows through the second supply lead is a measurement or supply current, for instance for a measurement device, which is low in relation to the current in the first supply lead.

The current in the first supply lead can be impressed by connecting the load of the system to the current source via the first supply lead, by the fact that the load creates an electrical connection to ground and, for example, brings about a mechanical effect. An electric motor, for instance, which brings about a torque when it is connected via the first supply lead to the current source, can serve as a load. Other loads or other forms of electrical loads can, however, also impress the current into the first supply lead.

The first voltage at the input of the first supply lead of the system can be determined by way of a voltage measuring apparatus that the system possesses. A further voltage measuring apparatus can be provided in the system for determination of the second voltage at the input of the second supply lead, which is configured to be at zero current when unloaded in the sense described above; or one voltage measuring apparatus can be configured, in accordance with a multiplex circuit, to determine both the first and the second voltage.

The first resistance value, i.e., the resistance value that can be associated with the first supply lead, is then obtained as the difference between the first voltage and the second voltage by way of a calculation using Ohm's law and a value of the impressed current.

The value of the impressed current can be ascertained by way of a functional correlation with the voltage present at the load; or the system or the load itself can have a sensor for determining the current value.

With this method, which switches a second supply lead to zero current for determination of the electrical resistance of the electrical supply lead in order to be able, by way of that zero-current second supply lead, to tap off the voltage at the connection point, i.e., a star point, of the two supply leads, it is possible, with a simple method and with existing switches and supply leads, to determine, in a reliable and accurate manner and without further costs, the electrical resistance of supply leads that are safety-relevant for a system.

In accordance with an example embodiment of the present invention, the electrical system can be, in particular, an electrical braking system that is provided in particular for a vehicle.

The sequence of method steps is presented in this description in such a way that the method is easy to comprehend. One skilled in the art will recognize, however, that many of the method steps can also be executed in a different sequence and lead to the same result.

According to an example embodiment of the method of the present invention, it is provided that in a further step of the method, an electrical connection is configured between the second supply lead and the load. In a further step, an electrical interruption is configured between the first supply lead and the electrical loads of the system. In a further step, a current is impressed in the second supply lead. In addition, a third voltage at the input of the second supply lead of the system is determined, the current being impressed in the second supply lead.

In addition, a fourth voltage at the input of the first supply lead of the system is determined, the current likewise being impressed in the second supply lead. In a further step, a third resistance value of the second supply lead is determined by way of the third and the fourth voltage and the impressed current.

Because the system is configured to electrically connect the load selectably to the first or to the second supply lead, it is possible to determine the resistance value of the second supply lead analogously to the above-described method for the first supply lead. The above-described method can thus be utilized analogously to ascertain the resistance in the second supply lead.

According to an example embodiment of the method of the present invention, it is provided that a no-load voltage at the input of the second supply lead of the system be determined, with no current being impressed in the first supply lead.

A second resistance value that is effective between the current-source-side contact point of the two supply leads and the ground contact is determined by way of the second voltage, the no-load voltage, and the impressed current.

As already stated above, it is not only the electrical resistance of the first and of the second supply lead that is relevant in terms of supplying sufficient electrical energy to the system; in addition, the connection of the load to the second pole of the electrical energy source, including the internal resistance of the energy source or current source, must have a sufficiently low resistance value that the voltage drop also remains low in this part of the electrical energy supply lead.

This no-load voltage can be determined using the same voltage measuring device that has already been described above for determining the voltage at the second supply lead. Measurement of the no-load voltage requires, however, that the first supply lead also be switched to zero current in the sense described above, which can be accomplished either by corresponding switch positioning of the three switches already described above, or by the fact that the load itself is configured to accept no electrical energy. This can be achieved, for example, by the fact that control is applied accordingly to inverters that supply energy to a load in the form of a motor having an electrical commutator. The resistance value is calculated in accordance with the calculation explained above.

With this embodiment it is thus possible, in simple and economical fashion, also to check the second part of the system for delivering electrical energy to a load of the system in terms of resistance, and thus to check a functionality of a safety-relevant system.

According to a further embodiment of the method of the present invention, it is provided that the no-load voltage be determined when, during the determination of the no-load voltage, no further changes in current are impressed in the connection of the current-source-side contact point of the two supply leads and the ground connection.

This increases the accuracy of the measurement of the no-load voltage, and can require that a higher-order control unit switch other current consumers to zero current, that other current consumers not be switched on or not change their power consumption within the measurement time, or that a corresponding operating state, for instance a test state, in which changes to the power consumption of other current consumers is precluded, exist. An operating state of this kind can also exist outside a power cycle, however, both immediately before and after a power cycle, for instance if test routines are still being run, or also after a vehicle has been completely shut down. A "power cycle" is defined upon startup of a vehicle, and ends with shutdown of a vehicle.

According to a further embodiment of the method of the present invention, it is provided that the current be impressed by way of the load, and that the load represent a component of a braking system. Such a component could be a motor that is provided in order to build up a hydraulic pressure in the braking system, with the result that an existing system can be used to determine the resistance of a supply lead.

According to a further embodiment of the method of the present invention, it is provided that the current be impressed by way of the load, and that control be applied to the load in a test mode using pulsed currents, without causing an external effect other than impression of the current.

With an electronically commutated electric motor, electronic control can be applied in a test mode, for example, in such a way that the electronically commutated electric motor absorbs an electric current without externally exhibiting a rotation or a torque.

The existing motor can thus be used, at a suitable moment during operation or in a suitable operating state, to establish a defined electrical load for the energy source or current source without producing an interfering external effect. The magnitude of the load can also be adjusted by way of a suitable application of control to the motor.

According to a further embodiment of the present invention, it is provided that the current be impressed by way of the load, and that the load be operating in the normal mode of the system.

The normal mode is the entirely normal operating mode of the system, which can mean for a braking system, for instance, actuation in the normal driving cycle. The resistance can thus be determined in the normal driving cycle, for example in order to check the braking system in terms of its performance capability. This is because if the intended operating voltage is not available to the braking system, a maximum effect may not be achieved, or not achieved quickly enough. An operating situation or operating mode that is, for example, particularly suitable in terms of safety or analysis aspects can also be selected by a higher-order system for this check.

According to a further embodiment of the method of the present invention, it is provided that a load operated in a special mode interact with a second device, for example a further subassembly, in such a way that the load operated in the special mode has no effect externally, in particular no mechanical effect, except for impressing a current into the first supply lead.

The advantage of such an embodiment of the present invention is that the resistance is checked outside an operating mode if another load that is placing a correspondingly high load on the supply lead, outside a power cycle, is not available. For example, a motor could build up a pressure against closed valves.

According to a further embodiment of the method of the present invention, it is preferred that at least one calibrated value, of the voltages or of the impressed current, be used to determine the first or the second resistance value.

According to a further embodiment of the method of the present invention, it is provided that upon determination of the first or of the second resistance value by way of a calibrated value, at least one of the calibrated values be calculated by way of a linear functional correlation, and that that functional correlation be ascertained before determination of one of the voltages or of the impressed current. In other words, the calibration of the measured values is effected by way of a linear function, and its offset value or its slope is determined and stored, for instance, in the context of manufacture. By way of this linear function, a measured value can then be converted into a calibrated value.

With this kind of embodiment of the method having a calibration, it is possible to improve the accuracy with which the voltage and currents for determination of the resistance are determined, even though the voltage sensors or current sensors being used exhibit systematic errors. In practice, more-economical sensors can thus be used. Such a calibration can refer to an offset or to a linear factor for correcting the sensor values; with nonlinear errors, a correction curve can also be stored for such a calibration.

According to a further embodiment of the method of the present invention, it is provided that the calibration of the voltage or of the impressed current be carried out in a manufacturing step of the system in which other tests of the system are also carried out.

Such a calibration can be integrated, with little outlay, into a manufacturing process for such a system, for instance a braking system, if measurements are carried out in the context of other tests, for instance upon final checking of an electronic component.

According to a further embodiment of the method of the present invention, it is provided that for determination of the first or of the second resistance value, at least one of the voltages or the impressed current be corrected in such a way that systematic deviations are reduced before at least one of the resistance calculations is carried out.

This kind of systematic deviation from a target value in the resistance calculation can be attributed in terms of origin to the electronic load being used, for instance an electronically commutated motor, but for cost reasons it is simpler to utilize such a load for the determination of the resistance value of a supply lead and to correct the resulting deviations by way of a downstream compensation for the systematic errors. This can be done automatically either by way of a functional correlation or by way of a stored table.

According to a further embodiment of the method of present invention, it is provided that at least one of the determined resistance values be corrected in such a way that systematic deviations of the resistance value are reduced.

With this embodiment of the method, either additionally or alternatively to the correction of measured voltages and/or measured currents, the resistance values resulting from the measured voltages or currents are corrected in a manner corresponding to that described above respectively for the currents or voltage. In other words, systematic deviations of the determined resistance values can be compensated for via a factor or an offset of a linear correction, or nonlinear correlations can be compensated for by way of a stored table associating measured and corrected values.

According to a further embodiment of the method of the present invention, it is provided that at least one of the voltages, or the impressed current, or the ascertained resistance, have associated with it a respective quality value that characterizes the quality of the respective determination of the measured variable.

According to a further embodiment of the method of the present invention, it is provided that the quality value of at least one of the determined voltages, or of the impressed current, or of the ascertained resistance, be determined by way of at least one absolute condition of the result, of the measured value, of a ripple of the measured value, of a duration of the measurement, or of a temperature of individual components during the measurement.

According to a further embodiment of the method of the present invention, it is provided that before a current is impressed in the first supply lead, a check is made as to whether a special state of a vehicle that possesses such a system exists, before a current outside a regular operating mode is impressed in the first supply lead.

According to a further embodiment of the method of the present invention, it is proposed that the above-described method for determining an electrical resistance of an electrical supply lead be interrupted upon occurrence of a special state during the method.

If the system is, for example, a braking system, it is necessary for safety reasons to make braking readiness available at any time, by the fact that the method for determining the electrical resistance of a supply lead can be interrupted at any time.

In accordance with an example embodiment of the present invention, a method for predicting a voltage drop across at least one electrical resistance of one of the electrical supply leads of the electrical system is described, the resistance value determined in accordance with the disclosure herein, a limit current and/or at least one of the voltages and/or the impressed current, and preferably at least one of the corresponding quality values, being utilized for the prediction.

For electrically operated systems that are safety-relevant, it is important to be able to predict whether such a system, for example a braking system, remains functional under maximum stress. This is because if the voltage that is available to the load decreases because of high stress on the system due to elevated resistance values of the supply lead, then as a result not only can the performance capability of the load (in this example, therefore, the braking system) suffer performance degradation, but subassemblies that are part of the system can also be impaired, since they may possibly no longer be functional at the low voltage that is available. Hydraulic valves for the antilock braking system (ABS) can be recited as an example of such subassemblies. If the electrical resistance values of the supply lead can be checked at suitable time intervals, it is therefore possible to ensure thereby that, even when the maximum load is not being applied, when the maximum load is required the voltage available to the system is sufficient to keep both the braking system itself, and further subassemblies, operational and functional. If the result of such a prediction is that the safety-relevant system is not fully operationally capable, in particular mostly semiautomatic vehicles that are equipped with such a system can be limited as to their functionality. For example, the maximum speed can be reduced or certain maneuvers can be limited. For semiautomated vehicles this can mean that control is transferred back to the driver.

The quality of the determination of voltages and currents, or of the resistance values themselves, is taken into account for the prediction of a voltage drop in such a way that for a low quality, the determined values must be measured repeatedly before the corresponding prediction result is outputted.

According to a further embodiment of the method of the present invention for predicting a voltage drop, it is provided that the electrical resistance between the current-source-side contact point of the two supply leads and the ground connection be utilized for the prediction.

As described above, a voltage drop that degrades the performance capability of the system can also occur in the ground connection of the system.

According to a further embodiment of the method of the present invention for predicting a voltage drop, it is provided that a control application signal for applying control to an at least semiautomated vehicle, and/or a warning signal to warn a vehicle occupant, is emitted depending on the predicted voltage drop.

The reason is that if the prediction indicates that the safety-relevant system, for instance the braking system, does not have complete performance capability, a corresponding action must occur either to warn the driver or, in the case of an at least semiautomated vehicle, to apply control correspondingly to it.

An apparatus that is configured to carry out a method as described above is described.

A computer program product that encompasses instructions which, upon execution of the program by a computer, cause the latter to execute one of the methods described above, is described.

A machine-readable storage medium, on which the above-described computer program product is stored, is described.

BRIEF DESCRIPTION OF THE DRAWINGS

Exemplifying embodiments of the present invention are depicted in FIGS. 1 and 4 and are explained in further detail below.

DETAILED DESCRIPTION OF EXAMPLE EMBODIMENTS

Figure 4:
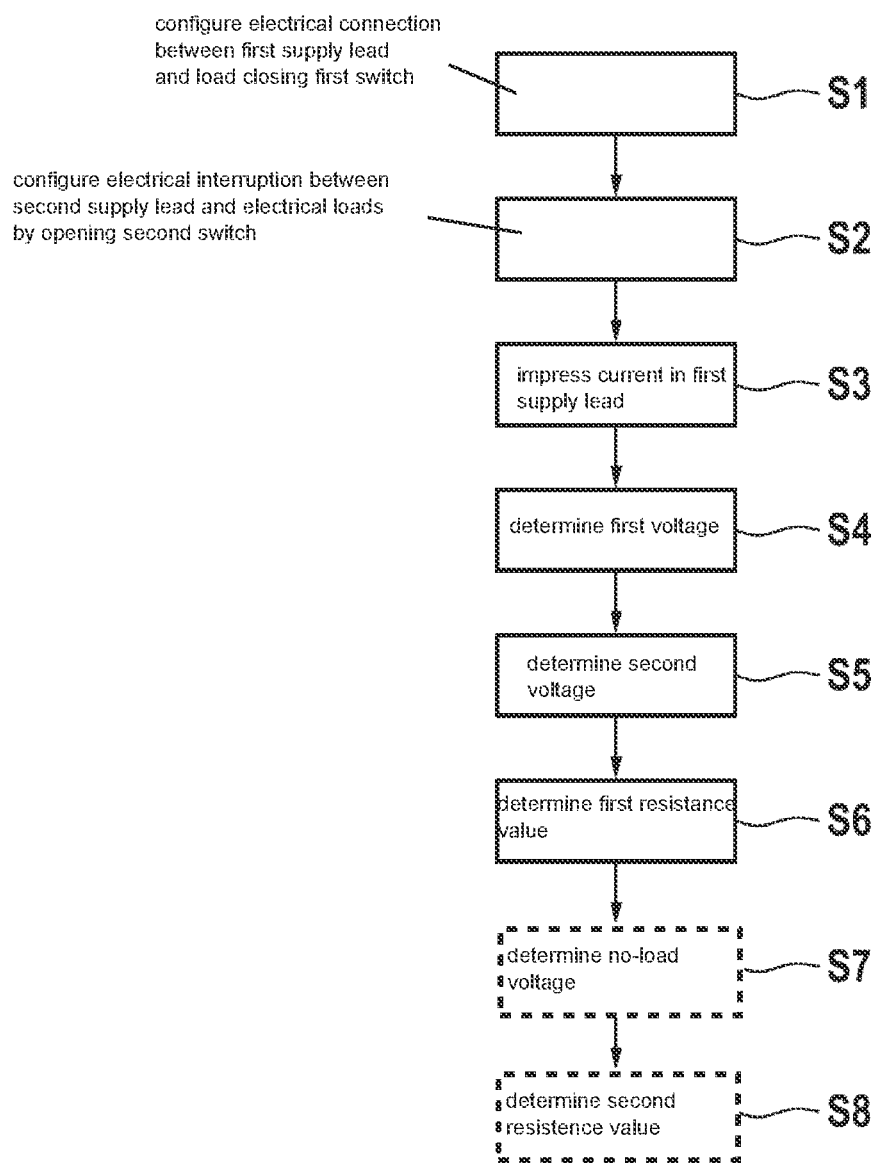
FIG. 4 shows steps of a method for determining an electrical resistance, in accordance with an example embodiment of the present invention.

The method for determining the first electrical resistance of electrical supply lead 131 of system 140 will be described with reference to FIG. 1 and FIG. 4.

Figure 1:
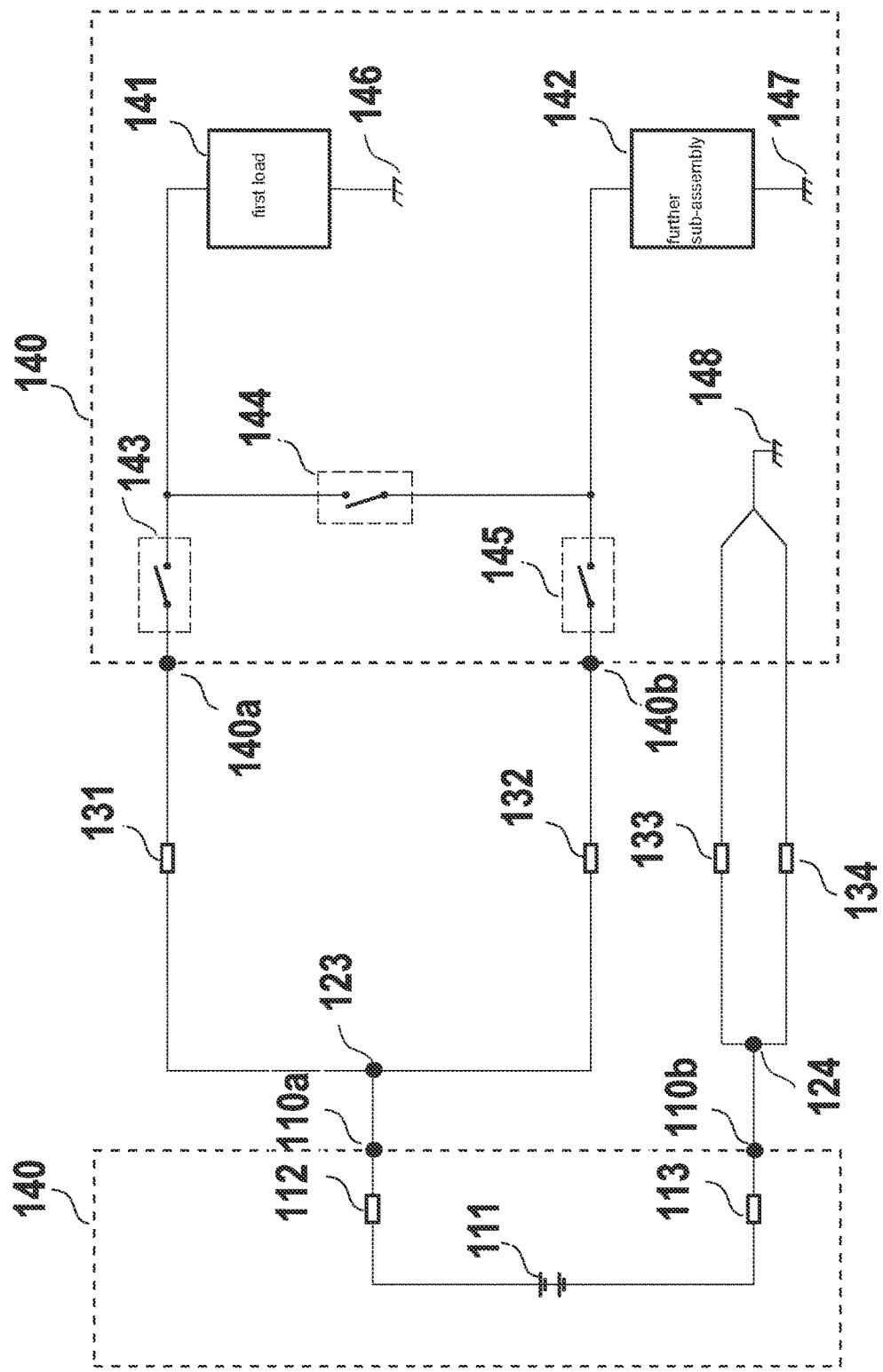
FIG. 1 shows an electrical system having a first and a second electrically conductive supply lead, a current source, and a ground connection of the current source.

FIG. 1 schematically shows an electrical system 140 that is connected with a first electrically conducting supply lead 131 to a first terminal 140a of the system, and with a second electrically conducting supply lead 132 to a second terminal 140b of the system, the two supply leads 131, 132 being connected to one another on the current-source side at a star point or connection 123.

Star point 123 is connected, by way of a first terminal 110a, to current source 110. A second terminal 110b of the current source is connected via two parallel-connected ground connections 133, 134 to ground terminal 148 of the system. The two parallel-connected ground connections 133, 134 are connected to one another on the current-source side via a ground star point 124.

In FIG. 1, the ground connection is designed redundantly with the two ground connections; 133, 134 this ground connection between current source 140 and ground 148 of system 140 can, however, also be designed as one lead or, for example, as an electrically conductive chassis.

Electrical system 140 has a first switch 143 that is disposed between first terminal 140a and a first load 141 in such a way that a conducting connection can be selectably established between first load 141 and first terminal 140a of system 140.

Electrical system 140 has a second switch 145 that is disposed between second terminal 140b and further subassembly 142 of system 140 in such a way that a conducting connection can be selectably established between further subassembly 142 and second terminal 140b of system 140.

First switch 143 and second switch 145 can be electrically connected to one another selectably by way of a third switch 144 that is contacted to first switch 143 and to second switch 145 respectively on the side located oppositely from terminals 140a, 140b. Load 141 of system 140 is connected by way of a ground connection 146 to second contact 110b of current source 110. Further subassembly 142 of system 140 is connected by way of a ground connection 147 to second contact 110b of current source 110. Current source 110 can be described by an ideal current source 111 that is connected via its respective internal resistances 112, 113 with its first terminal 110a and its second terminal 110b of current source 110.

For the determination of electrical resistance 131 of the first electrical supply lead of electrical system 140, an electrical connection is configured S1 between first supply lead 131 and load 141 by the fact that first switch 143 is closed. An electrical interruption between second supply lead 132 and electrical loads 141, 142 of system 140 is configured S2 by the fact that second switch 145 of system 140 is opened. With this connection to current source 110 by way of first switch 143 and load 141 of system 140, a current is impressed S3 in first supply lead 131, since load 141 is also connected via its ground connection 146 to second pole 110b of current source 110. For the case in which load 141 of system 140 does not represent a passive electrical load, load 141 must have control applied to it by a control circuit (not shown in system 140 of FIG. 1) for impression of a current.

The method described here can be applied analogously in order to ascertain the resistance of the second supply lead, by impressing the current of load 141 on second supply lead 132 by the fact that second switch 145 and third switch 144 are closed and first switch 143 is opened. The voltages and currents, and the resistance of second supply lead 132, are determined analogously to what has been described above.

The first voltage is determined S4 at input 140a of first supply lead 131 of system 140 using a voltage sensor or a voltage measuring device (not shown in FIG. 1). A current is impressed in first supply lead 131 as a result of the connection of load 141 to current source 110 by way of the closed switch 143.

The second voltage is determined S5 at input 140b of second supply lead 132 of system 140 using a voltage sensor or voltage measuring device (not shown in FIG. 1). First resistance value 131 of the first supply lead is determined S6 by way of the first and the second voltage and the impressed current, in accordance with Ohm's law, by dividing the difference between the two voltages by the impressed current. With a passive load 141 of system 140, the impressed current is obtained using Ohm's law when the applied voltage is known. Load 141 can, however, also have a current sensor or current measuring device that determines the current that is being impressed in first supply lead 131.

The no-load voltage can be determined at input 140b of second supply lead 132 of system 140, using the voltage sensor described above, without impressing the current in first supply lead 131, for example by opening S7 switch 143 of system 140.

The second resistance value, which acts between the current-source-side contact point 123, i.e. the star point of the two supply leads 131, 132 and ground contact 148 of system 140, can be determined S8 by way of the zero-load voltage, the no-load voltage, and the impressed current.

Figure 2A:
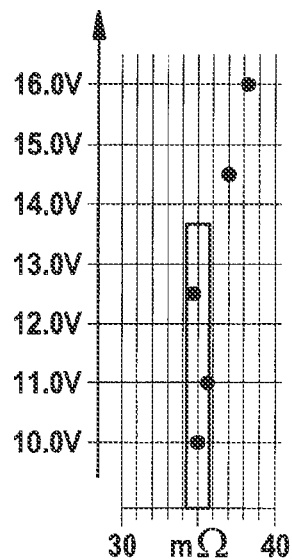
FIGS. 2A to 2D show systematic deviations of a resistance determination.
Figure 2B:
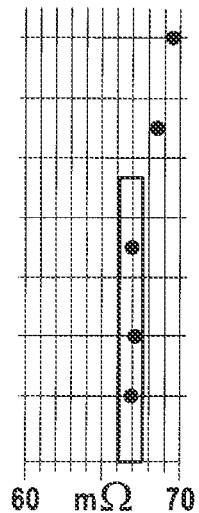
Figure 2C:
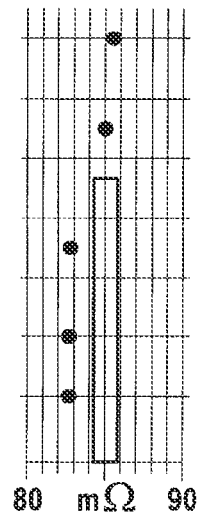
Figure 2D:
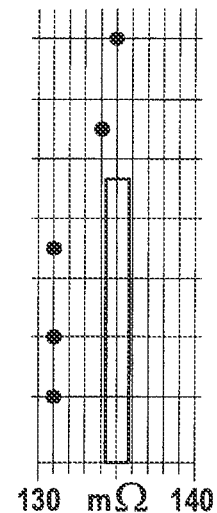
Figure 3A:
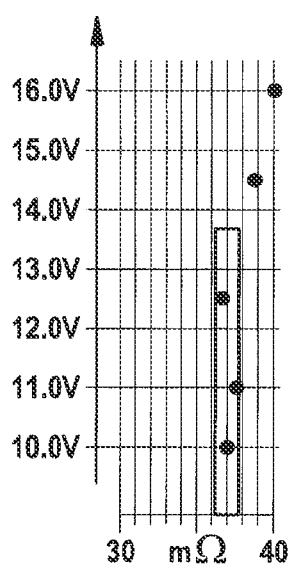
FIGS. 3A to 3D show systematic deviations of a resistance determination.
Figure 3B:
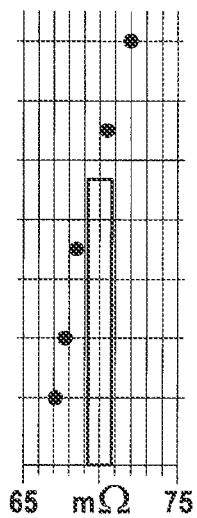
Figure 3C:
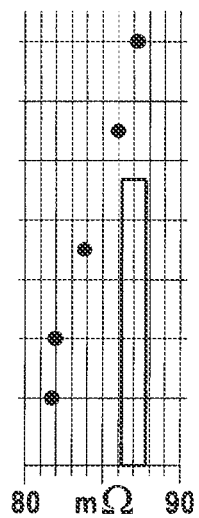
Figure 3D:
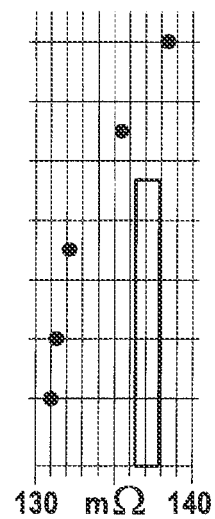

FIGS. 2A to 2D show how electrical resistance 131, 132 is determined systematically at different magnitudes, depending on the magnitude of the system voltage, by way of a load 141 of system 140, for example an electronically commutated electric motor. The target value of the measurement of electrical resistance 131, 132 which is depicted in the diagram of FIG. 2A is equal to 35 mOhm. As is evident from the diagram of FIG. 2A, at higher system voltages the measured value systematically deviates toward an excessively high determined value for the resistance. FIGS. 2B to 2D show, in corresponding diagrams, that with additionally introduced target resistance values of 33 mOhm, 50 mOhm, or 100 mOhm, this effect becomes systematically intensified as the effective resistance values become higher.

FIGS. 3A to 3D show measurements, corresponding to the measurements of FIGS. 2A to 2D, that were measured at lower impressed currents and with the same measurement duration as the measurement of FIGS. 2A to 2D, in which the above-described effect of the systematic deviation of measured values from the target value is even more pronounced.

What is claimed is:
1. A method for determining at least one electrical resistance of an electrical supply lead of an electrical system, the system being connected to at least a first electrically conductive lead and a second electrically conductive supply lead, the first and second supply leads being electrically conductively connected on a current-source side, and the system being configured to electrically connect an electrical load of the system selectably to the first supply lead or to the second supply lead, the method comprising the following steps:
  configuring an electrical connection between the first supply lead and the load;
  configuring an electrical interruption between the second supply lead and the first load and a further load of the system;
  impressing a current in the first supply lead;
  determining a first voltage at an input of the first supply lead of the system, with the impressed current in the first supply lead;

determining a second voltage at an input of the second supply lead, with the impressed current in the first supply lead;

determining a first resistance value of the first supply lead of the system by way of the first and the second voltage and the impressed current;

determining a no-load voltage at the input of the second supply lead of the system, with no current being impressed in the first supply lead; and determining a second resistance value that is effective between a current-source-side contact point of the first and second supply leads and a ground contact, using a zero-load voltage, the no-load voltage, and the impressed current.

2. The method as recited in claim 1, wherein the no-load voltage is determined when, during the determination of the no-load voltage, no further changes in current are impressed in a connection of the current-source-side contact point of the first and second supply leads and the ground connection.

3. The method as recited in claim 1, wherein the current is impressed using the load of the system, and control is applied to the load in a test mode using pulsed currents, without causing an external effect other than impression of the current.

4. The method as recited in claim 1, wherein at least one calibrated value, of the first and second voltages or of the impressed current, is used to determine the first or the second resistance value.

5. The method as recited in claim 1, wherein for determination of the first or of the second resistance value, at least one of the first or second voltages or the impressed current is corrected in such a way that systematic deviations are reduced before at least one resistance determination is carried out.

6. The method as recited in claim 1, in which at least one of the first and second resistance values is corrected in such a way that systematic deviations of the first or second resistance value is reduced.

7. The method as recited in claim 1, where at least one of the first or second voltages, or the impressed current, or the first or second resistance values, has associated with it a respective quality value that characterizes a quality of a respective determination.

8. The method as recited in claim 7, wherein he quality value of at least one of the first or second voltages, or of the impressed current, or of the ascertained first or second resistance values, is determined by way of at least one absolute condition of a result, of a measured value, of a ripple of the measured value, of a duration of the measurement, or of a temperature of individual components during the measurement.

9. A method for predicting a voltage drop across at least one electrical resistance of a electrical supply lead of the electrical system, the system being connected to at least a first electrically conductive lead and a second electrically conductive supply lead, the first and second supply leads being electrically conductively connected on a current-source side, and the system being configured to electrically connect a load of the system selectably to the first supply lead or to the second supply lead, the method comprising the following steps:

configuring an electrical connection between the first supply lead and the load;

configuring an electrical interruption between the second supply lead and the first load and a further load of the system;

impressing a current in the first supply lead;

determining a first voltage at an input of the first supply lead of the system, with the impressed current in the first supply lead;

determining a second voltage at an input of the second supply lead, with the impressed current in the first supply lead;

determining a first resistance value of the first supply lead of the system by way of the first and the second voltage and the impressed current;

predicting the voltage drop using the first resistance value and: (i) a limit current, and/or (ii) a least one of the first and second voltages, and/or (iii) the impressed current;

determining a no-load voltage at the input of the second supply lead of the system, with no current being impressed in the first supply lead; and determining a second resistance value that is effective between a current-source-side contact point of the first and second supply leads and a ground contact, using a zero-load voltage, the no-load voltage, and the impressed current.

10. The method as recited in claim 9, wherein a control application signal for applying control to an at least semi-automated vehicle, and/or a warning signal to warn a vehicle occupant, is emitted depending on the predicted voltage drop.

11. An apparatus configured to determine at least one electrical resistance of an electrical supply lead of an electrical system, the system being connected to at least a first electrically conductive lead and a second electrically conductive supply lead, the first and second supply leads being electrically conductively connected on a current-source side, and the system being configured to electrically connect a load of the system selectably to the first supply lead or to the second supply lead, the apparatus configured to:

configure an electrical connection between the first supply lead and the load;

configure an electrical interruption between the second supply lead and the first load and a further load of the system;

impress a current in the first supply lead;

determine a first voltage at an input of the first supply lead of the system, with the impressed current in the first supply lead;

determine a second voltage at an input of the second supply lead, with the impressed current in the first supply lead;

determine a first resistance value of the first supply lead of the system by way of the first and the second voltage and the impressed current;

determining a no-load voltage at the input of the second supply lead of the system, with no current being impressed in the first supply lead; and determining a second resistance value that is effective between a current-source-side contact point of the first and second supply leads and a ground contact, using a zero-load voltage, the no-load voltage, and the impressed current.

12. A non-transitory machine-readable storage medium on which is stored a computer program including instructions for determining at least one electrical resistance of an electrical supply lead of an electrical system, the system being connected to at least a first electrically conductive lead and a second electrically conductive supply lead, the first and second supply leads being electrically conductively connected on a current-source side, and the system being configured to electrically connect a load of the system selectably to the first supply lead or to the second supply lead, the instructions, when executed by a computer, causing the computer to perform the following steps:
  configuring an electrical connection between the first supply lead and the load;
  configuring an electrical interruption between the second supply lead and the first load and a further load of the system;
  impressing a current in the first supply lead;
  determining a first voltage at an input of the first supply lead of the system, with the impressed current in the first supply lead;
  determining a second voltage at an input of the second supply lead, with the impressed current in the first supply lead;
  determining a first resistance value of the first supply lead of the system by way of the first and the second voltage and the impressed current;
  determining a no-load voltage at the input of the second supply lead of the system, with no current being impressed in the first supply lead; and
  determining a second resistance value that is effective between a current-source-side contact point of the first and second supply leads and a ground contact, using a zero-load voltage, the no-load voltage, and the impressed current.

* * * * *